United States Patent
Fujita et al.

(10) Patent No.: US 6,204,959 B1
(45) Date of Patent: Mar. 20, 2001

(54) SIGNAL LIGHT MONITOR AND OPTICAL AMPLIFIER USING THE SAME

(75) Inventors: Masayuki Fujita; Miwa Saeki, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/987,916

(22) Filed: Dec. 9, 1997

(30) Foreign Application Priority Data

Dec. 10, 1996 (JP) .................................................. 8-329801

(51) Int. Cl.[7] .................................................. H01S 3/00
(52) U.S. Cl. ........................ 359/341; 359/124; 359/177
(58) Field of Search ............................... 359/341, 124, 359/177

(56) References Cited

U.S. PATENT DOCUMENTS

| | | | |
|---|---|---|---|
| 5,644,423 | * 7/1997 | Iwano | 359/337 |
| 5,818,629 | * 10/1998 | Kinoshita | 359/341 |
| 5,828,486 | * 10/1998 | Yoshida | 359/341 |
| 5,870,217 | * 2/1999 | Itou et al. | 359/179 |
| 5,933,262 | * 8/1999 | Sasagawa | 359/127 |

FOREIGN PATENT DOCUMENTS

| | | |
|---|---|---|
| 7-202811 | 8/1995 | (JP) . |
| 8-139672 | 5/1996 | (JP) . |
| 9-64819 | 3/1997 | (JP) . |

OTHER PUBLICATIONS

Japanese Office Action dated Jun. 2, 1998 with English language translation of Japanese Examiner's comments.

Japanese Office Action, dated Dec. 22, with English language translation of Japanese Examiner's comments.

* cited by examiner

*Primary Examiner*—Mark Hellner
(74) *Attorney, Agent, or Firm*—Whitham, Curtis & Whitham

(57) ABSTRACT

A signal light monitor having a first optical branching coupler disposed in an optical fiber transmission line for branching a part of an inputted signal light and outputting a first branched light, a first wavelength tunable filter for transmitting a first particular wavelength component included in the first branched light and outputting a transmitted light and a first sweeper for sweeping a transmission center wavelength of the first wavelength tunable filter within a range of the first particular wavelength component. The transmitted light outputted from the wavelength tunable filter is received by a first optical receiver and converted into an electric signal and sampled by a first sampling device. The first sampling data is stored in a first storage device. A waveform of electric signal from optical receiver is stored in the first storage device as a series of data. Based on the stored sampling data, an arithmetic processing section detect an existence of light signal identifying a steep change in the waveform. The arithmetic processing section detects a level of light signal from a peak of the steep change and wavelength of signal light from the time difference between a time when the sweep of the wavelength tunable filter is started and a time when a peak level of the detected steep change is detected. The arithmetic processing section detects noise light level near signal light from the first waveform and calculates signal-to-noise ratio from the detected signal light level and the detected noise light level.

20 Claims, 6 Drawing Sheets

FIG.3
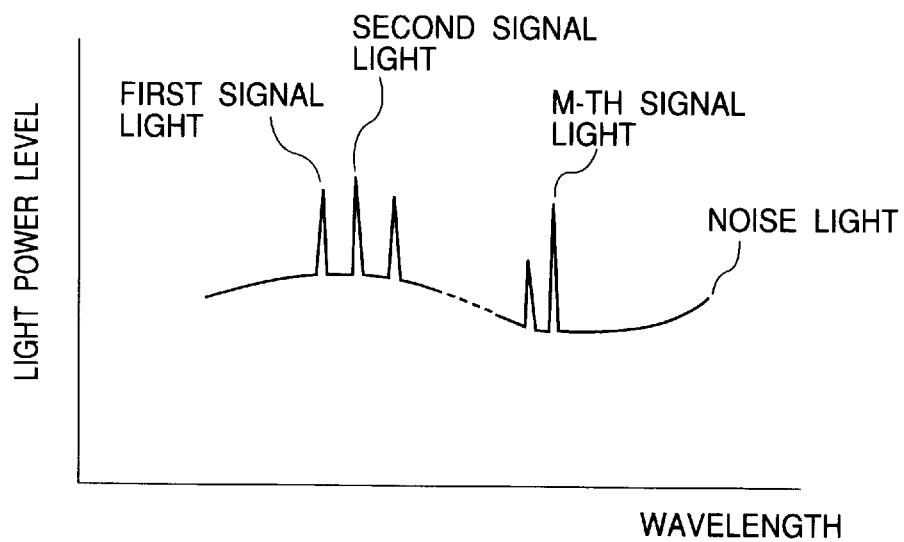
(a)
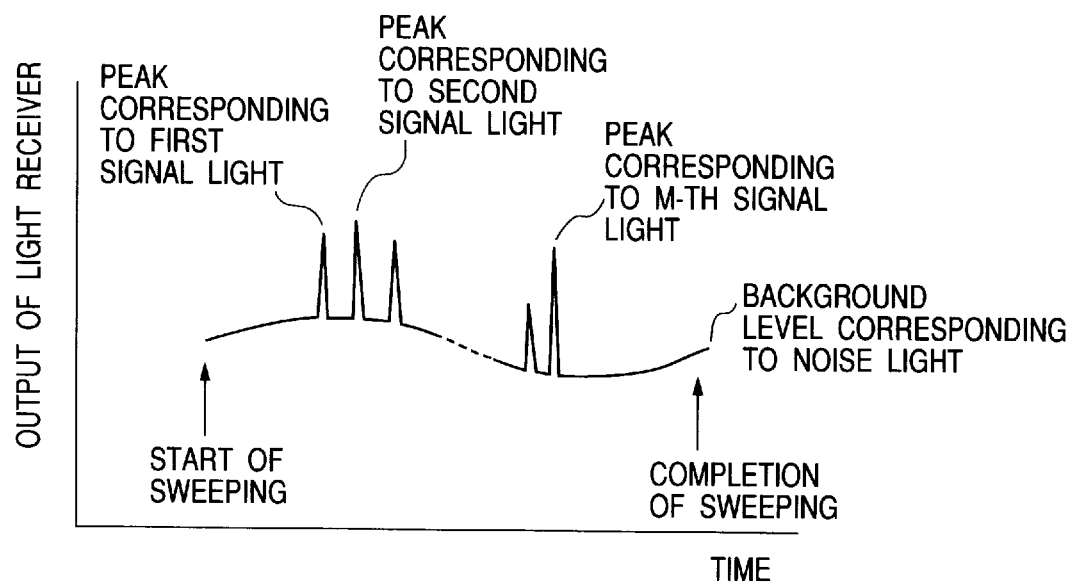
(b)

MONITORING OUTPUT

MONITORING OUTPUT

SIGNAL LIGHT MONITOR AND OPTICAL AMPLIFIER USING THE SAME

BACKGROUND OF THE INVENTION

1. Field of the Invention

The present invention relates to a signal light monitor and an optical amplifier using the same, which are used in an optical communication system.

2. Description of the Related Art

In an optical communication, as one means for increasing transmission capacity, a wavelength multiplexed light transmission system for transmitting a plurality of optical signals of different wavelengths by one optical fiber has been used. With an increase in demand for long-distance transmission, the use of a system having an optical amplifier interpolated in an optical fiber transmission line has become general.

Among optical amplifiers, an optical fiber amplifier using an optical fiber doped with rare earth element in its core as a gain medium and a semiconductor amplifier using stimulated emission phenomena inside a semiconductor are known. As a commercially available optical amplifier at present, an optical fiber amplifier is typically used.

In an optical communication system, in order to facilitate system maintenance, there has been an increase in demand for a function for monitoring a power of an optical light propagated on an optical fiber transmission line, its wavelength, its signal-to-noise ratio, fluctuation in a signal light wavelength, and so on, in a connection point between a terminal station device or an optical amplifier and the optical fiber transmission line. In the light amplifier, a level for sending out a light to the optical fiber transmission line is maintained constant and a transmission characteristic is made stable. Accordingly, its signal light output must be maintained constant. Also, a function for monitoring a signal light must be provided for controlling the operation of the optical amplifier.

Conventionally, as such an optical signal monitor, an optical signal power monitor installed inside an optical fiber amplifier has typically been used. In this conventional monitor, an optical branching device is disposed in the light output section of the optical amplifier. A part of a light output is branched by the optical branching device and received by an optical receiver. A pumping light output power of a pumping light source is controlled so that the level of this received light becomes constant. In this way, a light output of the optical fiber amplifier is maintained constant. However, if a signal light monitor for system maintenance employs the above-described system which is constructed in the manner that the optical branching device is disposed in the optical fiber transmission line and a branched light is received by the optical receiver, it is full light power including noise light that can be monitored. Consequently, even if this conventional system is used for the signal light monitor for system maintenance, a signal to noise ratio of a signal light, signal light power of each signal light wavelength of a wavelength multiplexed optical signal or fluctuation in a signal light wavelength cannot be monitored.

Furthermore, if the foregoing system were used as a monitor for controlling the optical amplifier, the following problem is involved in the conventional system. Generally, the optical amplifier outputs not only an amplified signal light and but also an amplified spontaneous emission (ASE) from a gain medium.

Consequently, it is impossible to monitor only signal light power in reality. A ratio of ASE light power in the entire output light power is changed according to an input light level of the optical amplifier. Thus, even if an output light level monitored by the optical receiver is controlled to be constant, signal light output power cannot be maintained constant.

SUMMARY OF THE INVENTION

It is a first object of the present invention to provide signal light monitor for realizing a function for monitoring power of each signal light for each signal light wavelength of a wavelength multiplexed signal light and a function for monitoring a signal light wavelength of a wavelength multiplexed signal light.

It is a second object of the present invention to provide an optical amplifier having a function for accurately controlling a signal light output to be constant irrespective of a spontaneously emitted light. In this case, the optical amplifier enables monitoring of a noise figure for each signal light wavelength of an amplified wavelength multiplexed signal light.

The first objective of the present invention is achieved by a signal light monitor, which comprises a first optical branching device disposed in an optical fiber transmission line for branching a part of an inputted signal light and outputting a first branched light, a first wavelength tunable filter for transmitting a first particular wavelength component of the first branched light and outputting a transmitted light and a first sweeper for sweeping a transmission center wavelength of the first wavelength tunable filter within the first particular wavelength range.

The signal light monitor of the present invention further comprises a first optical receiver for receiving a transmitted light outputted from the wavelength tunable filter and converting this light into an electric signal and a first sampling device for sampling a first electric signal and outputting first sampling data. The first sampling data is taken out from a first storage device for continuously storing the first sampling data on order of the time. Thus, the wave form of the first electric signal is stored in the first storage device as series of sampled data.

The signal light monitor yet further comprises first arithmetic processing section for identifying the existence of a signal light by detecting a steep change of the data stored in the first storage device, and for detecting a signal light power from a peak level of the steep change. The first arithmetic processing section also measures a signal light wavelength from a time when a peak of the steep change appears in the waveform stored in the first storage device. Furthermore, the first arithmetic processing section detects a noise light level from a bottom level of the steep change in the waveform, and calculates signal-to-noise ratio from the noise level and the above-described signal level.

The first wavelength tunable filter provided in the signal light monitor includes any one of an interference filter using a dielectric multilayer film, a Fabry-Perot etalon, a waveguide and a fiber grating.

The second objective of the present invention is achieved by a light amplifier, which comprises an optical amplifying section for amplifying an inputted signal light and outputting the amplified signal light and a first optical branching device for a signal light monitor having the above-described characteristics, the branching coupler being disposed in the output side of the light amplifying section.

The optical amplifier also comprises a signal light level control section for controlling the output of an optical amplifying section so as to maintain a signal light level constant. The light amplifier comprises a light amplification stopping function for stopping the operation of the light amplifying section if no signal light exists, based on the result of identifying the existence of a signal light by an arithmetic processor.

The optical amplifier is a light amplifying section for amplifying an inputted signal light and outputting the amplified signal light, and a signal light monitor having the above-described characteristics is disposed in the input side of the light amplifying section.

The optical amplifier comprises signal light monitors having the above-described characteristics in both input and output sides, and the above-described arithmetic processing section for perform the calculation based on the both the first and second storage device. The optical amplifier comprises a light amplification gain control function for calculating a gain of the light amplifying section based on a ratio between a signal light level of a signal light inputted to the light amplifying section and a signal light level of the output side and controlling the light amplifying section so as to maintain this gain constant.

The optical amplifier further comprises a second light amplification stopping function for stopping the operation of the optical amplifying section if no signal light exists based on an identifying result of the arithmetic processing section. The optical amplifier comprises a light amplification failure determining function for determining a failure of the light amplifying section if no signal light exists in the output side while a signal light exists in the input side based on identifying results of the arithmetic processing section.

For the light amplifying section of the optical amplifier, an optical fiber amplifier using an optical fiber doped with a rare earth element as a gain medium or a semiconductor light amplifier using stimulated emission phenomenon in a semiconductor can be used.

BRIEF DESCRIPTION OF THE DRAWINGS

The above and other objects, features and advantages of the present invention will become more apparent from the following detailed description when taken in conjunction with the accompanying drawings in which:

FIG. 3(*a*) is a view showing one example of a spectrum of a transmitted signal light inputted to the signal light monitor of the present invention for the purpose of illustrating an operation of the signal light monitor;

FIG. 3(*b*) is a view showing one example of an output waveform of a light receiver constituting the signal light monitor of the present invention for the purpose of illustrating the operation of the signal light monitor;

DETAILED DESCRIPTION OF THE PREFERRED EMBODIMENTS

First, in order to facilitate understanding of the present invention, a signal light monitor and an optical amplifier which have conventionally been used will be described before the description of a signal light monitor of the present invention and an optical amplifier using this monitor.

Figure 1:
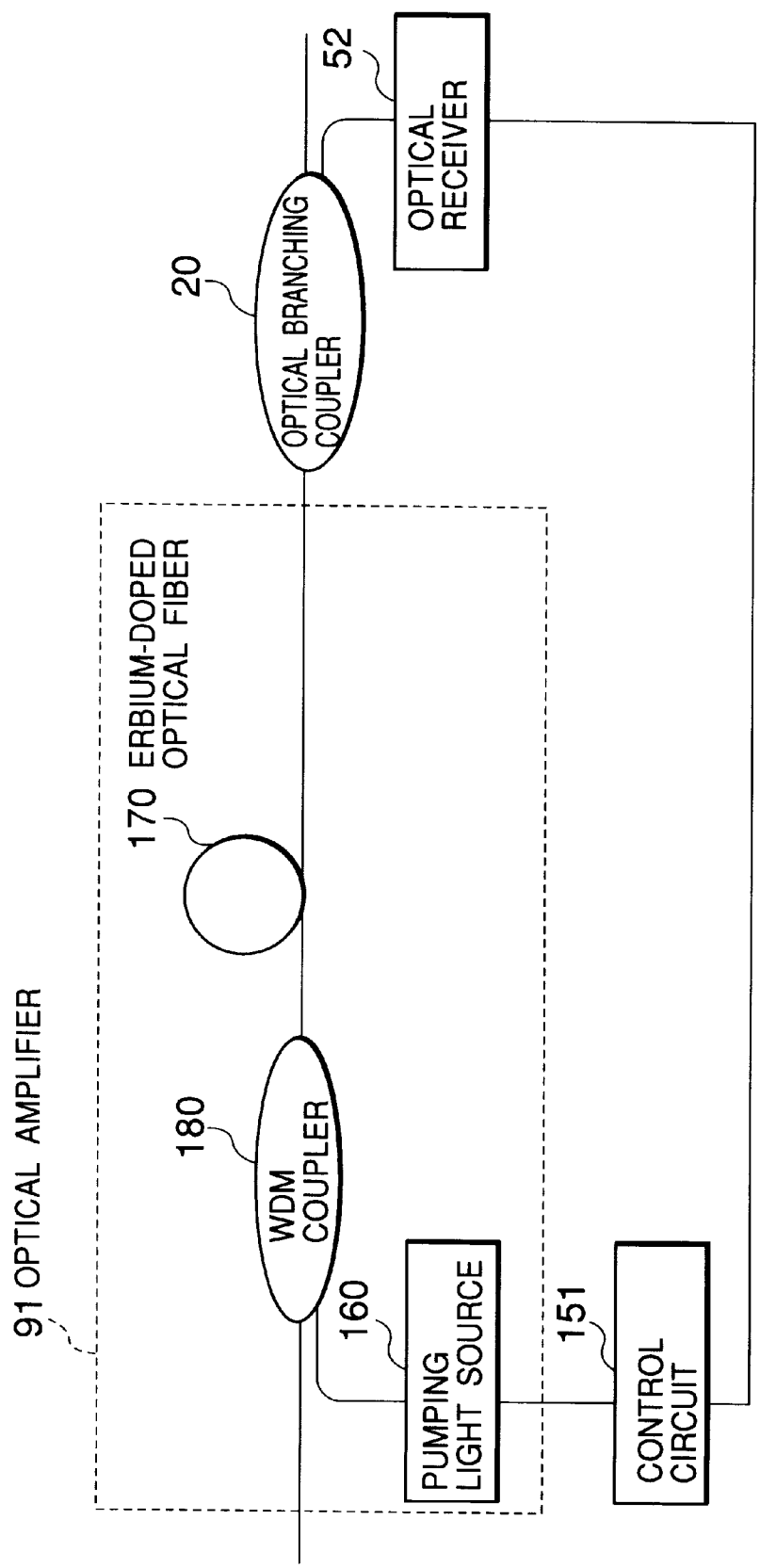
FIG. 1 is a block diagram showing a structure of a conventional optical amplifier.

Referring to FIG. 1, one example of a conventional optical amplifier is shown. An optical amplifier 91 shown includes an optical branching coupler 20 disposed in its light output section. A part of a light output is branched by the optical branching coupler 20 and then received by an optical receiver 52. The pumping light output power of a pumping light source 160 is controlled by the control circuit 151 so as to maintain constant the level of this received light. In this way, the light output of the optical fiber amplifier is maintained constant.

If the above-noted system is employed for a signal light monitor used for system maintenance, the system being constructed in a manner that the optical branching coupler 20 is disposed in an optical fiber transmission line and a branched light is received by the optical receiver 52, it is overrall light power that can be monitored. Consequently, even if the system is used for the signal light monitor for system maintenance, a signal-to-noise ratio of a signal light, signal light power for each signal light wavelength of a wavelength multiplexed signal light, or fluctuation in a signal light wavelength cannot be monitored.

If the above-noted system is employed for a monitor used for controlling the optical amplifier, the following problem arises. Generally, the optical amplifier outputs not only an amplified signal light but also a light spontaneously emitted in a gain medium. Accordingly, it is impossible to monitor only signal light power actually. The ratio of spontaneously emitted light power in entire output light power is changed according to the input light level of the optical amplifier. Consequently, even if an output light level monitored by the optical receiver is controlled to be constant, signal light output power cannot be made constant.

Next, the basic constitution of the signal light monitor of the present invention and its operation principle will be described.

Figure 2:
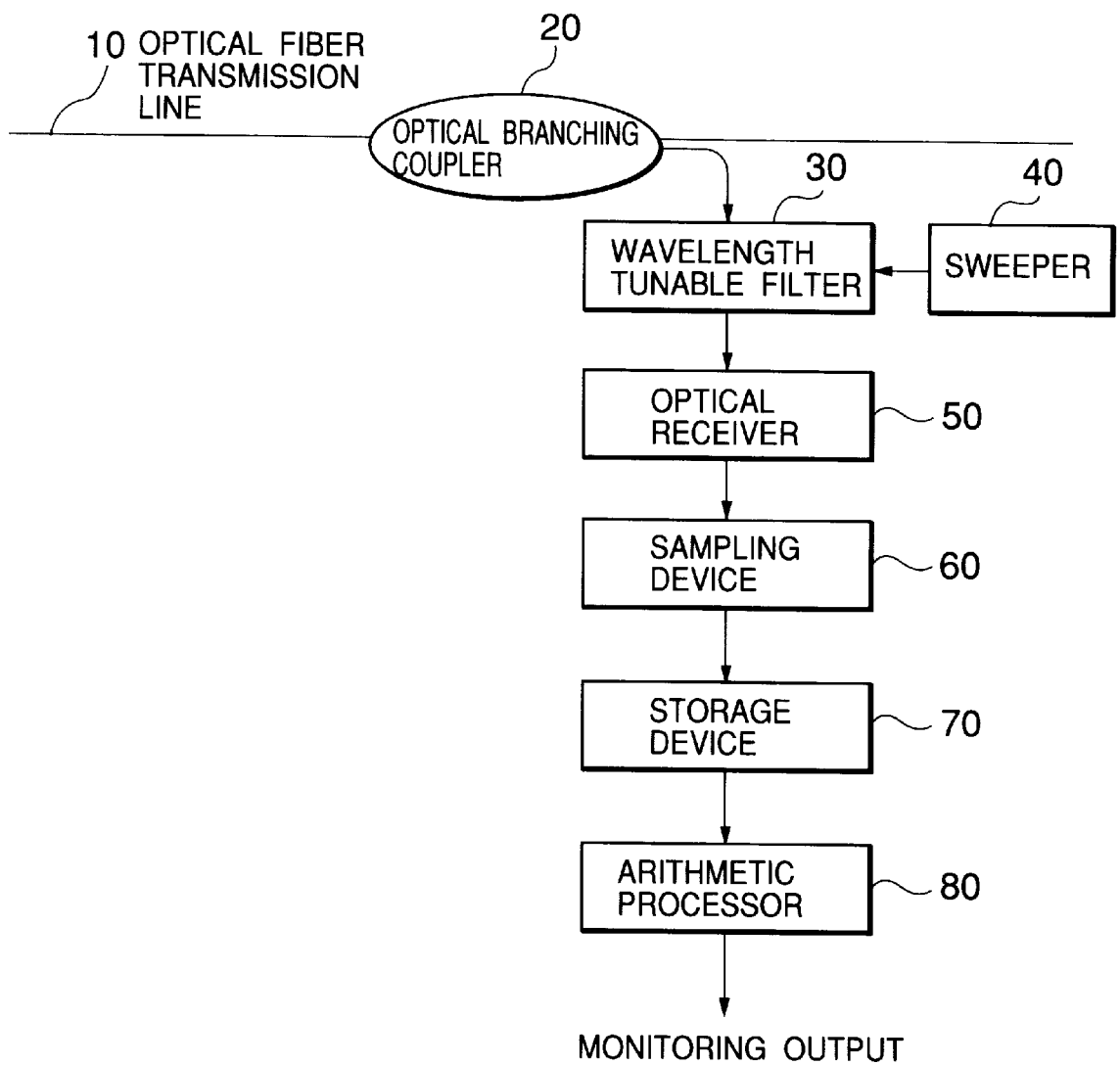
FIG. 2 is a block diagram showing a structure of a signal light monitor of the present invention.

As shown in FIG. 2, the signal light monitor of the present invention comprises an optical branching coupler 20 interpolated in an optical fiber transmission line 10, a wavelength tunable filter 30 for transmitting a particular wavelength light component included in a light branched by the optical branching coupler 20, a sweeper 40 for wavelength of transmitted light through the wavelength tunable filter 30 within a specified wavelength range and an optical receiver 50 for receiving the transmitted light of the wavelength tunable filter 30. The signal light monitor further comprises a sampling device 60 for sampling continuously the outputs of the optical receiver 50, a storage device 70 for storing the output from the sampling device 60 and an arithmetic processor 80 for arithmetic-processing the output waveform of the optical receiver 50 based on the data stored in the storage device 70.

The operation of the signal light monitor of the present invention will be described by referring to FIGS. 3(*a*) and 3(*b*).

According to a wavelength multiplexed optical communication system, typically, like a spectrum shown in FIG. 3(*a*), a plurality of signal lights (m in number) and noise lights distributed nearly uniformly within a wide wavelength range are superposed on one another and transmitted to the optical fiber transmission line 10.

The light propagated on the optical fiber transmission line 10 (referred to as a "transmitted signal light", hereinafter) is branched by the optical branching coupler 20 and guided to the wavelength tunable filter 30. The transmission center wavelength of the wavelength tunable filter 30 is swept by the sweeper 40 and then the change of light power (FIG. 3(*a*)) for the wavelength appears as the time-depending change of an output current (FIG. 3(*b*)) from the optical receiver 50.

In other words, when the transmission center wavelength of the wavelength tunable filter 30 coincides with each signal light wavelength, sharp peaks amounting to m in number appear in the output waveform of the optical receiver 50. The level of each peak is equivalent to a light level Ppk which is obtained by adding together each signal light Psk (k=1 . . . m) and a noise light level Pnk (k=1 . . . m) in each signal light wavelength, that is, Ppk=Psk+Pnk (k=1 . . . m). If the transmission center wavelength of the wavelength tunable filter 30 does not coincide with a signal light wavelength, since only a noise light is made incident on the optical receiver 50, a noise light level appears as a back-ground level (level other than that of a sharp peak) for the output waveform of the optical receiver 50.

The output of the optical receiver 50 is sampled by the sampling device 60. A waveform in the output of the sampling device 60 is stored in the storage device 70 as a series of sampled data.

The arithmetic processor 80 performs the following operations based on the output waveform data of the optical receiver 50 stored in the storage device 70:

a. the number m of signal lights contained in transmitted signal lights are detected from the number of peaks outputted from the optical receiver 50 and outputted;

b. light power Ppk (k=1 . . . m) in each signal light wavelength component contained in the transmitted signal light is detected from each peak level of the output of the optical receiver 50 and outputted;

c. an approximate value Pnk (k=1 . . . m) of noise light power contained in each signal light wavelength component is detected from a background level close to each peak of the output of the optical receiver 50 and outputted; and d. a wavelength λk (k=1 . . . m) of each signal light is detected from a time when each peak of the output of the optical receiver 50 appears and outputted.

In addition, the arithmetic processor 80 can calculate signal light power Psk (k=1 . . . m) in each signal light wavelength by subtracting Pnk from Ppk and a signal-to-noise ratio SNk (k=1 . . . m) based on Psk and Pnk and output the results of calculation.

Figure 4:
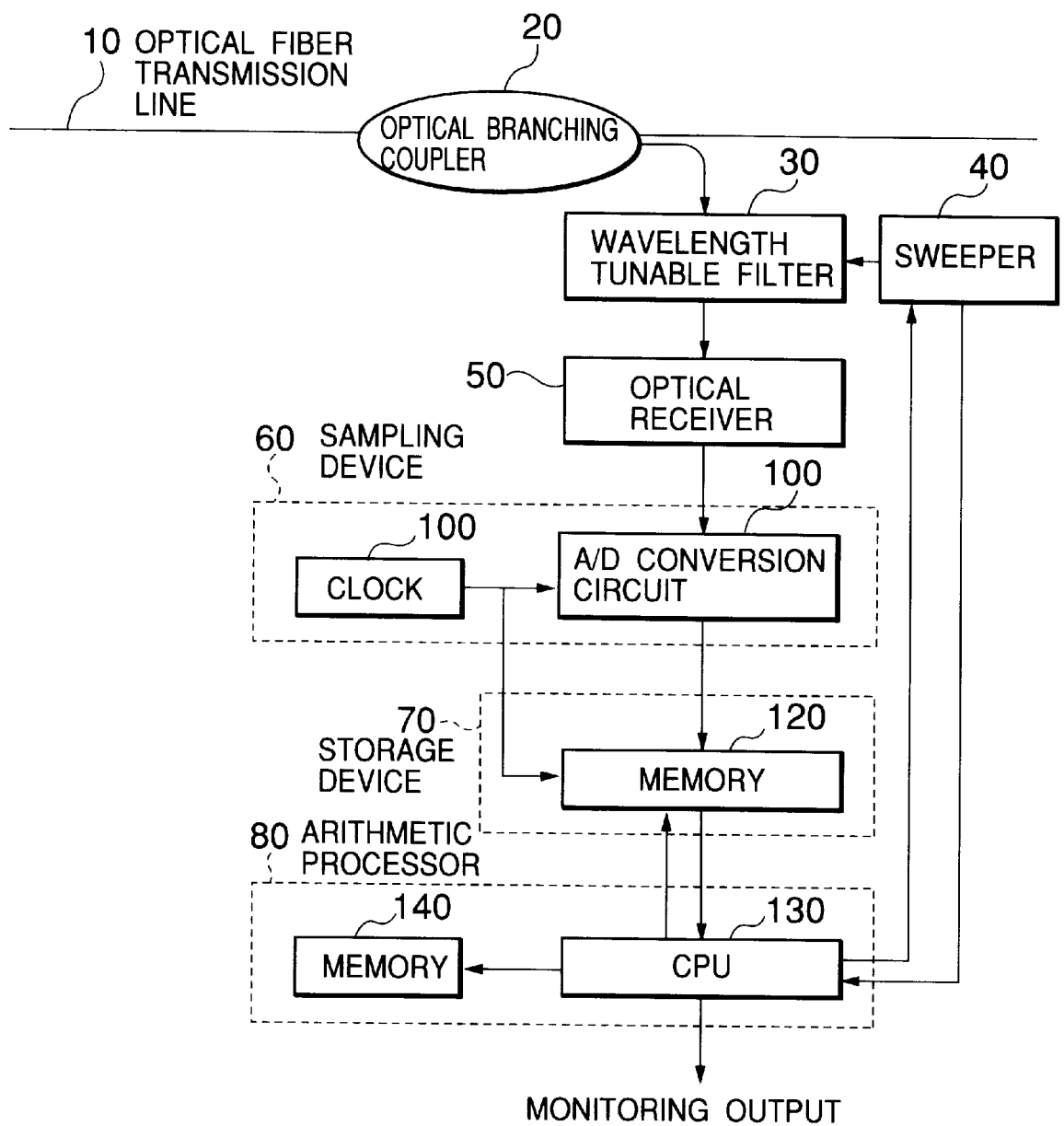
FIG. 4 is a block diagram showing an embodiment of the signal light monitor of the present invention.

Next, the embodiment of the signal light monitor of the present invention will be described. Referring to FIG. 4, there is shown a constitution of the embodiment of the signal light monitor of the present invention.

The optical branching coupler 20 is disposed in the optical fiber transmission line 10. A light branched by the optical branching coupler 20 is guided to the wavelength tunable filter 30. The transmission center wavelength of the wavelength tunable filter 30 is swept within a particular wavelength range by the sweeper 40 at a fixed speed V (nm/s). The light transmitted through the wavelength tunable filter 30 is detected by the optical receiver 50. The output of the light receiver 50 is inputted to an A/D conversion circuit 100.

The A/D conversion circuit 100 samples the outputs of the optical receiver 50 in sequence in synchronization with the pulses of a clock 110 and outputs the samples to a memory 120. The memory 120 stores the outputs of the A/D conversion circuit 100 while incrementing addresses by the pulses of the clock 110. Accordingly, the results of sampling the output waveforms of the optical receiver 50 at time intervals τ decided by the clock 110 are stored in the memory 120 time sequentially from an initial address. The arithmetic processor is composed of a CPU 130 and a memory 140 for storing a constant necessary for waveform data processing beforehand.

First, based on a sweep starting signal outputted from the CPU 130, a sweeping operation is started for transmission center wavelength of the wavelength tunable filter 30 by the sweeper 40 and also a storing operation is started by the memory 120. After the end of sweeping, a sweep end signal is outputted from the sweeper 40 to the CPU 130, and the storing operation of the memory 120 is stopped by a command issued from the CPU 130. In this way, the results of sampling the output waveforms of the light receiver 50 at time intervals τ decided by the output pulses of the clock 110 are stored in the memory 120 time sequentially. At this time, data stored in an adjacent address corresponds to light power away by a wavelength width Δλ (=V×τ)

The memory 140 stores a sweeping speed V for the transmission center wavelength of the wavelength tunable filter 30, a sweep starting wavelength λs, a sampling interval τ, conversion data for converting data outputted from the A/D converter 100 into light power transmitted through the optical branching coupler, and so on. These data are used for waveform data processing performed by the CPU 130.

The CPU 130 performs the following operations:

① the number m of peaks is counted;

② offset Ak is specified from the initial address of peak level data Dpk (k=1 . . . m, similar hereinafter) stored in the memory;

③ noise level data Dnk close to a peak level is specified;

④ a wavelength λk (=λs+V×τ×AK) is calculated from Ak;

⑤ data are converted from Dpk and Dnk into light power Ppk and Pbk transmitted through the optical branching coupler;

⑥ signal light power Psk transmitted through the optical branching coupler is calculated from Ppk and Pnk; and ⑦ a peak number, that is, a signal light number m, signal light power Psk in each signal light wavelength, a wavelength Ak of each signal light, a signal-to-noise ration SNk, and so on, are outputted from the CPU. These values can be renewed after the end of each sweeping if the sweeping operation is repeated by the sweeper 40.

For the above-described signal light monitor of the present invention, a filter for rotating a dielectric filter by a pulse stepping motor can be used for the wavelength tunable filter 30, and likewise a motor driving circuit for rotating a pulse stepping motor at a fixed speed for the sweeper 40 and a PIN photodiode for the light receiver. Four signal lights having different wavelengths are propagated on the optical fiber transmission line 10.

Procedures respectively for sweeping the transmission center wavelength of the wavelength tunable filter 30 by the sweeper 40 and storing the output waveforms of the optical receiver 50 by the memory 120 are as described above.

Conversion data stored beforehand in the memory 140 are as follows:

a. a speed V for sweeping the transmission center wavelength of the wavelength tunable filter 30 performed by the sweeper 40;

b. a sweep starting wavelength λs;

c. a sampling interval τ;

d. a proportional constant C for converting the output data of the A/D conversion circuit 100 stored in the memory 120 into light power transmitted through the light branching device 20;

e. a reference value R for detecting a waveform peak;

f. a shortest wavelength λmin (k) and a longest wavelength λmax (k) (k=1, 2, 3 and 4) taken by each signal light; and g. a maximum line width Δλc of a signal light.

A particular address of a memory 120 and a wavelength λ corresponding to this address can be expressed in the following manner:

$$\lambda = \lambda s + V \times \tau \times A \tag{1}$$

$$A = \text{int}\ [(\lambda - \lambda s)/(V \times \tau)] \tag{2}$$

Herein, int [ ] is an integer most approximate to a numerical value in [ ].

An arithmetic processor 80 performs the following operations:

(1) Detection of peak number, that is, the number of signal light wavelengths

Usually, a peak corresponding to a signal light shows a steep change. In other words, a difference in data between addresses adjacent to each other in the memory 120 is increased if a peak exists. Accordingly, the number of peaks can be counted based on the following procedure.

① Addresses Amin (k) and Amax (k) respectively corresponding to a shortest wavelength λ min (k) and a longest wavelength λ max (k) taken by each signal light are calculated by using the expression (2).

② For data from an address Amin (1) to an address Amax (1), a difference in data values between addresses adjacent to each other is calculated. If the result of calculation includes a value exceeding a reference value R, a signal light peak can be determined to exist within a range of a wavelength λmin(1) to a wavelength λmax(1). If the existence of a signal light peak is determined, a count m is set to 1.

③ Processing similar to that described in ② is performed for each of the addresses Amin (k) and Amax (k) of K=2, 3 and 4. If a signal light peak is determined to exist, m is incremented each time.

(2) Specification of peak data

For the address range from Amin (k) to Amax (k) in which the existence of the signal light peak is confirmed by the processing of (1), maximum value data and addresses Apk (K=1, 2, 3 and 4) within the address range are calculated.

(3) Specification of noise level data

① Address offset ΔAk is calculated from a signal light maximum line width Δλc by the following expression:

$$\Delta Ak = \text{int}\ [\Delta \lambda c/(V \times \tau)] + 1 \tag{3}$$

② Address Ank of noise level data is calculated by the following expression.

$$Ank = Apk + \Delta Ak\ (k=1, 2, 3\ \text{and}\ 4) \tag{4}$$

The data Dnk of an address Ank does not include any signal light components, because the data is for the light level of a wavelength away from a signal light peak by a signal light line width. Accordingly, the data Dnk can be considered as a noise light level approximate to a signal light wavelength.

(4) By using a proportional constant C stored in the conversion memory 120 for light power Ppk and noise light power Pnk of each signal light wavelength, Ppk and Pnk are calculated based on the following expression:

$$Ppk = C \times Dpk \tag{5}$$

$$Pnk = C \times Dnk \tag{6}$$

The proportional constant C is a constant decided by a transmission loss of the optical branching coupler 20, a transmission loss of the wavelength tunable filter 30, a light receiving sensitivity of the optical receiver 50, and so on. This constant can be experimentally decided.

(5) Calculation of each signal light power Psk

Power Pnk is a noise light level approximate to a signal light wavelength. Usually, no sudden change occurs in the noise light level against a wavelength. Accordingly, a value of this level can be considered as an approximate noise light level in a signal light wavelength. From Ppk and Pnk, power Psk of each signal light is calculated by the following expression:

$$Psk = Ppk - Pnk \tag{7}$$

(6) Calculation of a signal-noise ratio SNk of each signal light

From Psk and Pnk, power Psk of each signal light is calculated by the following expression:

$$SNk = Psk/(F \times Pnk) \tag{8}$$

Herein, a code F denotes a constant decided by a received light wavelength band in the optical receiver connected to the end of the optical fiber transmission line 10 during designing of an optical communication system. This constant may be stored in the memory 140.

(7) Calculation of wavelength of each signal light

From the address Apk for storing the signal light peak data, which is calculated in ②, a signal light wavelength λ k is calculated by the following expression:

$$\lambda k = \lambda s + V \times \tau \times Apk (K=1, 2, 3\ \text{and}\ 4) \tag{9}$$

The signal light number m, each signal light power Psk, each signal light wavelength λsk and the signal-to-noise ratio SNk of each signal light calculated in the above-described procedures are converted into parallel data or serial data by the CPU 130 and then outputted.

In this example, the motor driving circuit for rotating the pulse stepping motor of the wavelength tunable filter 30 at a fixed speed is shown to be used for the sweeper 40. However, the pulse stepping motor may be rotated by a specified angle directly based on a signal from the CPU 130.

For the wavelength tunable filter 30, one using Fabry-Perot etalon, a waveguide or a fiber grating can be used.

The sweeper 40 includes a function for sweeping the transmission center wavelength of the wavelength tunable filter 30. Needless to say, the sweeper 40 can take various forms according to the driving mechanism of a wavelength tunable filter 30 to be used. For example, if a wavelength tunable filter is one in which the gap length of Fabry-Perot etalon using a gap as a cavity is changed by a piezoelectric element, the sweeper 40 takes the form of an applied voltage sweeper. If a wavelength tunable filter is one in which the temperature of a waveguide or a fiber grating is changed by an electronic cooler, the sweeper 40 takes the form of a current sweeper for supplying a current to the electronic cooler.

Figure 5:
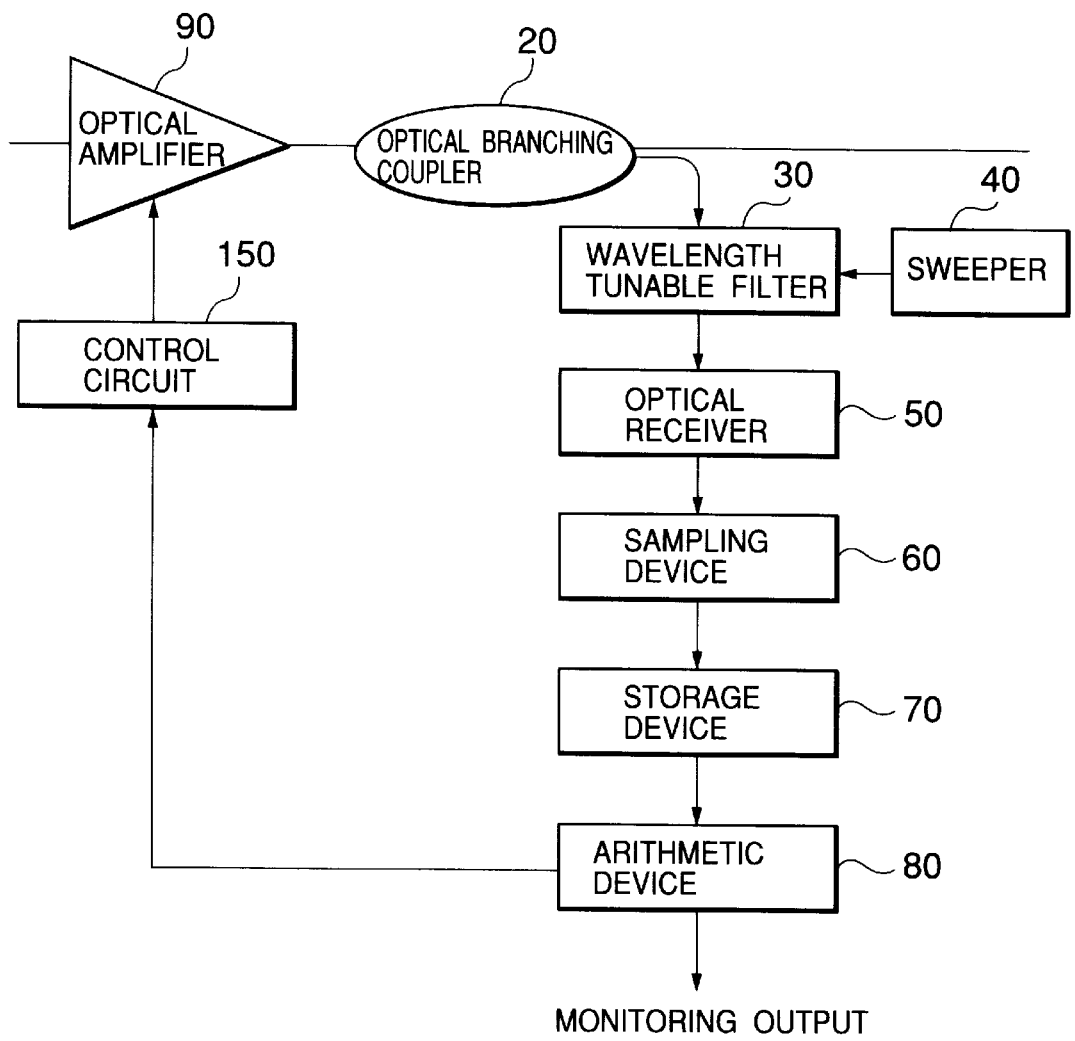
FIG. 5 is a block diagram showing a constitution of an embodiment of an optical amplifier using the signal light monitor of the present invention.

Referring now to FIG. 5, there is shown a first embodiment of the optical amplifier of the present invention.

This embodiment is an example for controlling the operation of a light amplifier 90, which comprises the optical branching coupler 20 of the signal light monitor shown in FIG. 2 interpolated in the output side thereof.

The operations and the specific embodiment of constituting element other than the optical amplifier 90 and a control circuit 150 are similar to those described above with reference to the embodiment of the signal light monitor. When the number m of signal lights detected by the arithmetic processor 80 is zero, in other words when there are no signal lights, the control circuit 150 stops the operation of the optical amplifier 90 so as to prevent unnecessary power consumption. The control circuit 150 controls the operation of the light amplifier 90 so as to make constant the level of a particular signal light calculated by the arithmetic processor 80.

For a particular signal light level used for controlling of the light amplifier 90, if a signal light having a smallest level among signal lights is used, a minimum value level of a signal light outputted from the light amplifier 90 is guaranteed. If a signal light having a largest level among signal lights is used, a maximum value level of a signal light outputted from the optical amplifier 90 is guaranteed.

For the light amplifier, an optical amplifier 90 using an optical fiber doped with a rare earth element as a gain medium or a semiconductor optical amplifier using stimulated emission phenomena in a semiconductor can be used.

Figure 6:
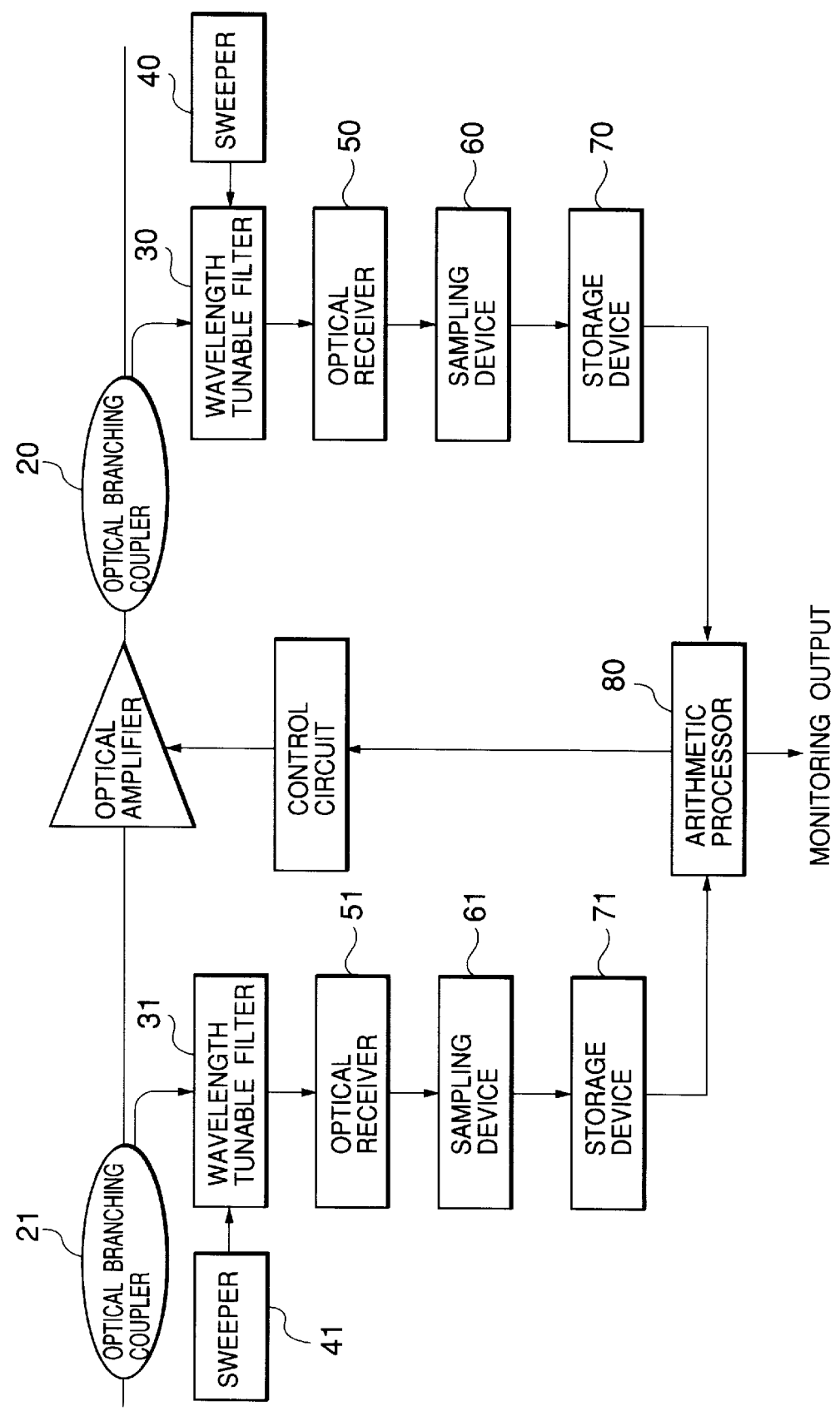
FIG. 6 is a block diagram showing a constitution of a second embodiment of an optical amplifier using the signal light monitor of the present invention.

Referring next to FIG. 6, there is shown a second embodiment of the optical amplifier of the present invention.

According to the second embodiment, the optical amplifier 90 shown in FIG. 5 further comprises an optical branching coupler 21 interpolated in the input side of thereof, a wavelength tunable filter 31 for transmitting a particular wavelength light component contained in light branched by the optical branching coupler 21, a sweeper 41 for sweeping a wavelength transmitted through the wavelength tunable filter 31 within a particular wavelength range, an optical receiver 51 for receiving a light transmitted through the wavelength tunable filter 31, a sampling device 61 for sampling the outputs of the optical receiver 51 and a storage device 71 for storing the time-depending change of the sampling device 61.

The arithmetic processor 80 performs processing like that described above with reference to the embodiment of the signal light monitor for each of the output light of the optical amplifier 90 detected by the optical receiver 50 and the input light of the optical amplifier 90 detected by the optical receiver 51.

The control circuit 150 can perform the following operations in addition to the operations described above with reference to the first embodiment of the optical amplifier.

(1) The operation of the optical amplifier 90 is stopped even when the number of signal lights included in an input light is zero. Accordingly, unnecessary power consumption can be prevented.

(2) Whether signal lights are included or not can be detected for both input and output lights. Accordingly, the abnormal operation of the optical amplifier 90 can be detected. In other words, if a signal light is included in an input light and a signal is included in an output light, the abnormal operation of the optical amplifier 90 can be determined.

(3) The levels of signal lights can be individually monitored for both input and output lights. Accordingly, the gains of the optical amplifier 90 for the signal lights can be individually detected. Thus, the optical amplifier 90 can be controlled based on the gain of a particular signal light so as to make its gain constant. In other words, if control is performed so as to make constant the gain of a signal light having a smallest gain, a minimum gain can be guaranteed for the optical amplifier 90. If control is performed so as to make constant the gain of a signal light having largest gain, a maximum gain can be guaranteed for the optical amplifier 90.

(4) The level of ASE from the optical amplifier 90 which is superposed on an output signal light, the level being approximate to each signal light wavelength, can be detected as a noise light. Accordingly, for each signal light, a noise figure in the optical amplifier 90 can be calculated and monitored. In other words, from the input level Pisk (k=1 ... m) and the output level Posk (k=1 ... m) of a signal light of kth in order and an ASE level Pnk (k=1 ... m) approximate to a signal light wavelength of kth in order included in an output light, the noise figure NFk (k=1 ... m) of the optical amplifier 90 regarding the signal light of kth in order can be calculated by the following expression.

$$Nfk = Pnk/(h \cdot vk \cdot \Delta v \cdot Gk)$$

$$Gk = Posk/Pisk \qquad \text{Expression (10)}$$

Herein, h denotes a plank constant, $vk$ ($=c/vk$, c a light speed) denotes a frequency of a light of a signal light of kth in order. $\Delta v$ ($=c \times \Delta \lambda f/\lambda k2$, $\Delta \lambda f$ 3 dB transmission band width of the wavelength tunable filter 30) denotes a frequency converted value of the transmission band width of the wavelength tunable filter 30. For the expression (10), reference may be made to, for an instance Paper C-168 included in Proceedings of Autumn Convention, 1992, The Institute of Electronics, Information and Communication Engineers.

The signal light monitor of the present invention is effective in that since only the optical branching coupler is interpolated in the optical fiber transmission line, the loss of a transmitted signal light propagated on the optical fiber transmission line can be reduced.

By taking out the wavelength spectrum of a transmitted signal light as a time-depending change in the output of the optical receiver, for a plurality of signal lights included in the transmitted signal light, the following physical quantities can be monitored: ① the number of signal lights, ② the level of each signal light, ③ the signal-to-noise ratio of each signal light and ④ the wavelength of each signal light.

The signal light monitor of the present invention is also effective in that by monitoring the output light of the light amplifying section, the optical amplifier having functions like those describe below can be provided.

① A function for stopping the operation of the light amplifying section if no output signal lights exist at all.

② A function for performing control so as to make constant an output regarding a particular signal light and accordingly a function for guaranteeing a minimum level or a maximum level of an output signal light.

By using the signal light monitor of the present invention in each of the input and output sides of the light amplifying section and monitoring each of the input and output lights of the light amplifying section, functions like those described below can be provided.

① A function for stopping the operation of the light amplifying section if no input signal lights exist at all.

② A function for determining the abnormal operation of the light amplifying section based on the fact that a signal light is included in an input light while no signal light is included in an output light.

③ A function for performing control so as to make constant a gain regarding a particular signal light and accordingly a function for guaranteeing a maximum gain or a minimum gain of the light amplifying section.

④ A function for monitoring a nose figure for each signal light based on a gain for each signal light and the level of ASE approximate to each signal light wavelength.

While this invention has been described in connection with certain preferred embodiments, it is to be understood that the subject matter encompassed by way of this invention is not to be limited to those specific embodiments. On the contrary, it is intended for the subject matter of the invention to include all alternative, modification and equivalents as can be included within the spirit and scope of the appended claims.

What is claimed is:

1. An optical amplifier signal light monitor comprising:

light amplifying means for amplifying an inputted signal light and outputting an amplified signal light;

an optical branching coupler, said optical branching coupler being disposed in an output side of said light amplifying means for branching a part of said amplified signal light and outputting a branched light;

a wavelength tunable filter for transmitting a particular wavelength component included in said branched light and outputting a transmitted light;

a sweeper for sweeping a transmission center wavelength of said wavelength tunable filter within a range of said particular wavelength component;

a optical receiver for receiving said transmitted light and converting said transmitted light into an electric signal;

sampling means for sampling said electric signal and outputting sampling data representative of a signal waveform;

a storage device for storing the sampling data; and an arithmetic processing means accessing the sampling data stored in the storage device and identifying the existence of signal light by detecting steep changes in said amplified signal light, said arithmetic processing means further including a means for detecting signal light level from peak level of said detected steep change.

2. The optical amplifier signal light monitor recited in claim 1, wherein said arithmetic signal processing means further determining the number of signal lights contained in said amplified signal light, and said means for detecting signal light level from peak level further detecting signal light levels for each of the signal lights contained in said amplified light signal.

3. The optical amplifier signal light monitor recited in claim 2, wherein said arithmetic processing means further determines a wavelength of each of said signal lights from a time when a peak for a signal light appears.

4. The optical amplifier signal light monitor recited in claim 3, wherein said arithmetic processing means detects an approximate value of noise light power contained in each of said signal lights, and said means for detecting signal light level from peak level calculates signal light power by subtracting detected noise light power from peak level.

5. The optical amplifier signal light monitor recited in claim 4, wherein said arithmetic processing means further calculates a signal-to-noise ratio from the detected noise light power and the calculated signal light power.

6. An optical amplifier comprising:

light amplifying means for amplifying an inputted signal light and outputting an amplified signal light;

an optical branching coupler, said optical branching coupler being disposed in an output side of said light amplifying means for branching a part of an inputted signal light and outputting a branched light;

a first wavelength tunable filter for transmitting a particular wavelength component included in said branched light and outputting a transmitted light;

a sweeper for sweeping a transmission center wavelength of said first wavelength tunable filter within a range of said particular wavelength component;

a optical receiver for receiving said transmitted light and converting said transmitted light into an electric signal;

sampling means for sampling said electric signal and outputting sampling data representative of a signal waveform;

an arithmetic processing means responsive to said sampling data and identifying the existence of signal light by detecting steep changes in said signal waveform, wherein said arithmetic proceeding means further includes:

a means for detecting noise light level near signal light from said signal waveform, and a means for calculating signal-to-noise ratio from said detected signal light level and said detected noise light level; and signal light level control means responsive to said arithmetic processing means for controlling an output of said light amplifying means to maintain a signal level constant based on a result of detecting a signal light level by said arithmetic processing means.

7. An optical amplifier comprising:

light amplifying means for amplifying an inputted signal light and outputting an amplified signal light;

a first optical branching coupler, said first optical branching coupler being disposed in an output side of said light amplifying means for branching a part of an inputted signal light and outputting a first branched light;

a first wavelength tunable filter for transmitting a particular wavelength component included in said first branched light and outputting a first transmitted light;

a first sweeper for sweeping a transmission center wavelength of said first wavelength tunable filter within a range of said particular wavelength component;

a first optical receiver for receiving said transmitted light and converting said transmitted light into a first electric signal;

first sampling means for sampling said first electric signal and outputting first sampling data representative of a first signal waveform;

a first storage device for storing the first sampling data;

a second optical branching coupler, said second optical branching coupler being disposed in an input side of said light amplifying means for branching a part of an inputted signal light and outputting a second branched light;

a second wavelength tunable filter for transmitting a particular wavelength component included in said second branched light and outputting a second transmitted light;

a second sweeper for sweeping a transmission center wavelength of said second wavelength tunable filter within a range of said particular wavelength component;

a second optical receiver for receiving said transmitted light and converting said second transmitted light into a second electric signal;

second sampling means for sampling said second electric signal and outputting second sampling data representative of a second signal waveform;

a second storage device for storing the second sampling data;

an arithmetic processing means accessing said first and second sampling data in said first and second storage devices and identifying the existence of signal light by detecting steep changes in said first and second signal waveforms, said arithmetic processing means further including a means for detecting signal light level from peak level of said detected steep change; and signal light level control means responsive to said arithmetic processing means for controlling an output of said light amplifying means to maintain a signal level constant based on a result of detecting a signal light level by said arithmetic processing means.

8. An optical amplifier according to claim 6, further comprising:

light amplification stopping means for stopping an operation of said light amplifying means when no signal light is founded to exist based on a result of identifying a signal light by an arithmetic processor.

9. An optical amplifier according to claim 1, wherein said arithmetic processing means further includes a means for detecting a level of amplified spontaneous emission from said light amplifying means near signal light from said first waveform; and a means for calculating noise figure from said detected signal light level and said detected amplified spontaneous emission level.

10. An optical amplifier according to claim 7, wherein said arithmetic processor means further includes a means for identifies the existence of signal light by detecting steep changes in said second waveform; and a means for detecting signal light level from peak level of said detected steep change in said second waveform.

11. An optical amplifier according to claim 10, further comprising:

a light amplifying gain control means for controlling to maintain a gain of said amplifying means constant.

12. An optical amplifier according to claim 11, wherein said light amplifying gain control means further includes a means for calculating said gain, based on a ratio between a signal light level of a signal light inputted into said light amplifying means and a signal light level in said output side.

13. An optical amplifier according to claim 10, further comprising:

a second light amplification stopping means for stopping an operation of said light amplifying means when no signal light is found to exist based on an identifying result of the existence of signal light in said second waveform.

14. An optical amplifier according to claim 10, further comprising:

a light amplification failure detecting means for determining a failure of said light amplifying means when no signal light is found to exist in said output side while a signal light exits in said input side based on an identifying result of the existence of signal light in said first and second waveform.

15. A signal light monitor according to claim 1, wherein said wavelength tunable filter includes an interference film filter including a dielectric multilayer film.

16. A signal light monitor according to claim 1, wherein said wavelength variable filter includes Fabry-Perot etalon.

17. A signal light monitor according to claim 1, wherein said wavelength variable filter includes a waveguide.

18. A signal light monitor according to claim 1, wherein said first wavelength variable filter includes a fiber grating.

19. An optical amplifier according to claim 10, wherein said light amplifying means includes an optical fiber amplifier using an optical fiber doped with rare earth element as a gain medium.

20. An optical amplifier according to claim 10, wherein said light amplifying means includes a semiconductor light amplifier using stimulated emission phenomena in a semiconductor.

* * * * *